United States Patent [19]

Inomata et al.

[11] Patent Number: 4,827,235
[45] Date of Patent: May 2, 1989

[54] MAGNETIC FIELD GENERATOR USEFUL FOR A MAGNETIC RESONANCE IMAGING INSTRUMENT

[75] Inventors: Koichiro Inomata; Tetsuhiko Mizoguchi; Naoyuki Sori, all of Yokohama; Hideki Yamamiya, Yamato; Isao Sakai, Yokohama, all of Japan

[73] Assignee: Kabushiki Kaisha Toshiba, Kawasaki, Japan

[21] Appl. No.: 73,184

[22] Filed: Jul. 14, 1987

[30] Foreign Application Priority Data

Jul. 18, 1986 [JP] Japan .................. 61-169411
Nov. 4, 1986 [JP] Japan .................. 61-260813

[51] Int. Cl.$^4$ .................. H01F 1/24; C04B 35/32
[52] U.S. Cl. .................. 335/297; 148/302; 310/44; 324/309
[58] Field of Search .................. 148/302, DIG. 1; 310/44, 152, 154; 324/309, 318, 319; 335/296, 303

[56] References Cited

U.S. PATENT DOCUMENTS

| | | |
|---|---|---|
| 4,308,474 | 12/1981 | Savage et al. .................. 310/26 |
| 4,656,449 | 4/1987 | Mallard et al. .................. 335/297 |
| 4,696,725 | 9/1987 | Ochiai et al. .................. 335/297 |

FOREIGN PATENT DOCUMENTS

| | | | |
|---|---|---|---|
| 175214 | 3/1986 | European Pat. Off. ............ 148/302 |
| 60-27105 | 2/1985 | Japan .................. 148/302 |
| 60-76104 | 4/1985 | Japan . |
| 60-88407 | 5/1985 | Japan . |
| 61-34242 | 8/1986 | Japan . |
| 174905 | 7/1987 | Japan . |

Primary Examiner—Patrick R. Salce
Assistant Examiner—D. L. Rebsch
Attorney, Agent, or Firm—Foley & Lardner, Schwartz, Jeffery, Schwaab, Mack, Blumenthal & Evans

[57] ABSTRACT

A magnetic field generator comprises a permanent magnet, and pole pieces magnetically connected to the permanent magnet. The pole pieces are disposed to face each other to generate a magnetic field between them, and have a specific resistance of 20 $\mu\Omega$-cm or more. The permanent magnet comprises a sintered alloy including iron as a main component, a rare earth element including yttrium, cobalt, and boron. The permanent magnet includes, as its main part, a strong magnetic Fe-rich phase of a tetragonal system, as well as a non-magnetic Laves phase, and preferably has a maximum energy product of 38 MGOe or more.

13 Claims, 4 Drawing Sheets

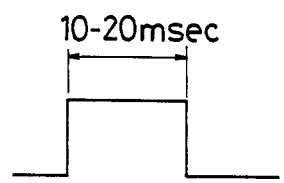
FIG. IA
10-20msec
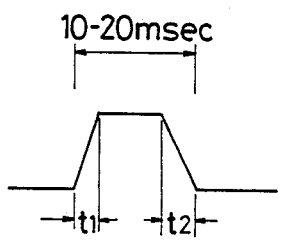
FIG. IB
10-20msec
t1  t2

MAGNETIC FIELD GENERATOR USEFUL FOR A MAGNETIC RESONANCE IMAGING INSTRUMENT

BACKGROUND OF THE INVENTION

The present invention relates generally to a magnetic field generator, and particularly to a magnetic field generator which is appropriate to be used for a medical nuclear magnetic resonance imaging instrument (MRI).

PRIOR ART

The MRI is an instrument having a space forming a strong magnetic field of about 1 to 20 KG into which a patient is positioned to obtain a required sectional image of the patient. Such a strong magnetic field is generated by a magnetic field generator using a normal-conductive magnet in which conductors made of copper, aluminum, etc., are wound as coils, or using a superconductive magnet which uses superconductors. Also, it has recently been studied to use a permanent magnet of a Nd—Fe—B system for the magnetic field generator, as disclosed in the Japanese Laid-Open Patent No. 60-76104, etc.

The MRI basically comprises the following four principal components. Namely, the above-mentioned magnetic field generator, magnetic field inclining coils (usually, three are disposed to provide magnetic field inclination in X, Y, and Z directions) for selecting a spatial position, an RF coil for generating a nuclear magnetic resonance in a test material positioned in the magnetic field, and a receiver.

The inclined magnetic field will be described in detail. In X-axis and Y-axis directions, an Y-axis (X-axis) magnetic field inclining coil provides an inclined magnetic field which is oriented in a Z-axis direction and has different strength depending on Y-coordinates (X-coordinates). The inclined magnetic field is overlapped on a stationary magnetic field $H_0$ to define a resonance angle frequency $\omega$ as follows:

$$\omega = \omega_0 + \gamma G_x \cdot X + \gamma G_y \cdot Y \tag{1}$$

where, $\omega_0 = \gamma H_0$; $\gamma$ a nuclear magnetic rotation ratio; and $G_x$ and $G_y$ inclined magnetic fields in X-axis and Y-axis directions respectively. As a result, depending on X and Y coordinates, different resonance angle frequencies are obtained for the stationary magnetic field space. The X-axis and Y-axis inclined magnetic fields of $$G_x = G_j \cos \theta, \; G_y = G_j \sin \theta \tag{2}$$

are overlapped and applied, and the $\theta$ is changed. Then, there is realized an inclined magnetic field in which a magnetic field inclination $G_j$ is constant and the direction (j-axis) of the inclination can freely be controlled.

As described in the above, spatially different resonance angle frequencies are obtained, and, by measuring the frequencies, spatial positions can be known.

The inclined magnetic field is generally given by pulses shown in FIG. 1A. The waveform of the pulse becomes the one shown in FIG. 1B by the following reasons, and a pulse rise time t1 and a pulse fall time t2 influence the S/N ratio of an image. If the t1 and t2 are large, the S/N ratio decreases. Namely, when a normal-conductive magnet or a superconductive magnet is used for the magnetic field generator, and when a pulse current is applied to the inclining coil to generate the inclined magnetic field, an eddy current is generated in normal-conductive coils or superconductive coils disposed in the vicinity of the inclining coil, thereby increasing the t1 and t2. Further, due to the energy consumption by the eddy current, a pulse current more than necessity is applied to the coils so that a large power source is needed. In practice, an electrical compensation is carried out to suppress the t1 and t2 under 2 ms. But this electrical compensation is an expensive measure increasing the cost.

According to the experiments performed by the inventors of the present application, it has been found that the same problems are caused in a magnetic field generator which uses a permanent magnet.

In order to obtain a highly accurate image by the MRI, it is indispensable to provide a magnetic field generator for generating a magnetic field in a predetermined spatial region, the magnetic field should have sufficient strength and excellent uniformity, as well as long term stability.

For such a magnetic field generator, there is used a normal-conductive magnet wound with coils of conductors made of copper, aluminum, etc., or a superconductive magnet using superconductors made of Nb—Ti alloys, etc., or a permanent magnet which has been studied recently as disclosed in, for instance, the Japanese Laid-Open Patent No. 60-76104.

The magnetic field generator using the normal-conductive magnet can provide a relatively strong and uniform magnetic field, but it requires a large amount of electricity and cooling water, increasing the cost, and has the problems of low time-stability in strength of the magnetic field and of large leakage magnetic field, necessitating a magnetic shield.

On the other hand, the magnetic field generator using the superconductive magnet has advantages that it has a sufficiently large magnetic field strength, excellent uniformity, less power consumption, and excellent time-stability; but it has drawbacks of large leakage magnetic field, and of the necessity of, as an essential condition, coolant of liquid helium which is very expensive.

The magnetic field generator using the permanent magnet circuit has advantages that it consumes less electric power and has less leakage magnetic field. However, it has a disadvantage that it is difficult to obtain required magnetic field strength and spatial uniformity in the magnetic field. In order to compensate these drawbacks to practically use the permanent magnet, the size of the magnet is extended. This, however, causes other problems, in that the weight of the system is increased, the cost is increased, and the installed space is limited.

Recently, an Nd—Fe—B system has been studied in many places as a new permanent magnet material, as disclosed in, for instance, the Japanese Patent No. 61-34242. The magnet is characterized in that it has a high energy product ranging from 30 to 35 MGOe, the materials Nd and Fe are cheaper than Sm and Co which are used for a conventional rare earth cobalt magnet. Therefore, as a magnet which can solve the problems of the prior art permanent magnet circuit, the new magnet of Nd—Fe—B has been widely studied to be incorporated in the magnetic field generator. Since a reversible temperature coefficient of the Nd—Fe—B system magnet is as large as −0.14%/deg, there are problems that the magnet is inferior in time-stability of the magnetic field, and, since the practical level of a maximum energy product is up to 35 MGOe, there is another problem that the volume of the magnet is increased.

SUMMARY OF THE INVENTION

In view of the above problems, an object of the present invention is to provide a magnetic field generator using a permanent magnet which can provide a strong magnetic field, the generator giving nearly no influence on the rise and fall of a pulse magnetic field to be generated by magnetic field inclining coils.

Another object of the present invention is to provide a compact and light magnetic field generator of a permanent magnet type, which can produce a magnetic field having sufficient strength, excellent spatial uniformity, and time-stability.

In order to accomplish the objects and advantages mentioned in the above, the present invention provides a magnetic field generator comprising permanent magnets, and pole pieces. The pole pieces are magnetically connected to the permanent magnets, disposed to face each other to generate a magnetic field between them, and have a specific resistance of 20 $\mu\Omega$-cm or more.

In the present invention, it is preferable to use a permanent magnet made of sintered alloy which includes iron as its main component, R (rare earth elements including yttrium), cobalt, and boron, and has a strong magnetic Fe rich phase as a main phase and a non-magnetic Laves phase, as well as having a maximum energy product of 38 MGOe or more.

BRIEF DESCRIPTION OF THE DRAWINGS

The other objects, features and advantages of the present invention will become apparent from the following descriptions of the preferred embodiments taken in conjunction with the accompanying drawings in which:

FIGS. 1A and 1B are views showing the waveform of an ideal pulse for generating an inclined magnetic field, and the waveform of an actual pulse for generating the inclined magnetic field;

DETAILED DESCRIPTION OF THE PREFERRED EMBODIMENTS

The preferred embodiments of a magnetic field generator according to the present invention will now be described with reference to the drawings.

Pole pieces used for the present invention are basically required to have large saturation magnetization and soft magnetism, as well as a specific resistance of 20 $\mu\Omega$-cm or more, but the other conditions are freely selected. For instance, there may be used not only soft magnetic materials such as permalloy, silicon steel, amorphous magnetic alloy, and ferrite, but also magnetic composite material. The magnetic composite material comprises magnetic powder such as iron powder, and a binding material made of electric insulating material such as rubber and resin. In practice, the magnetic composite material is preferable because it can easily realize a specific resistance as large as, for instance, several hundred $\Omega$-cm.

As a permanent magnet, there may be used a ferrite magnet, an Alnico magnet, a magnet of a rare earth cobalt system, and an R—Fe—B system magnet (the "R" is at least one of rare earth elements including Y). Compared to a magnet using coils, the permanent magnet consumes a small amount of electric power, and has a small leakage magnetic field. Further, by using a strong magnet such as the magnet of R—Fe—B system, a compact magnetic field generator is realized. For the permanent magnet of R—Fe—B system, it is preferred to use a material having a large (BH)max and comprising Nd for 13 to 16 atomic percents, B for 1 to 8 atomic percents, and Fe for the substantial remaining part.

A part of Nd may be substituted by other rare earth elements such as Pr, Tb, and Dy, or Fe may be substituted by one of, or the combination of elements such as Co, Al, and Ga. As a result, a coercive force and the temperature characteristics of a residual magnetic flux density can be improved, increasing the temperature stability of the magnetic field.

The inventors of the present invention have examined magnetic circuits with magnetic field inclining coils which generate pulse magnetic fields having less rise time and fall time, and found that it is effective to reduce the rise time and fall time if the specific resistance value of pole pieces is increased more than 20 $\mu\Omega$-cm. By using the pole pieces having such large specific resistance, the rise time and the fall time can be minimized to less than, for instance, 2 msec, thereby improving the S/N ratio of an image of the MRI, and reducing energy consumption due to eddy current.

The larger the specific resistance of the pole pieces, the more the effect thereof is expected. The specific resistance is preferably 100 $\mu\Omega$-cm or more, and preferably 150 $\mu\Omega$-cm or more.

Figure 2:
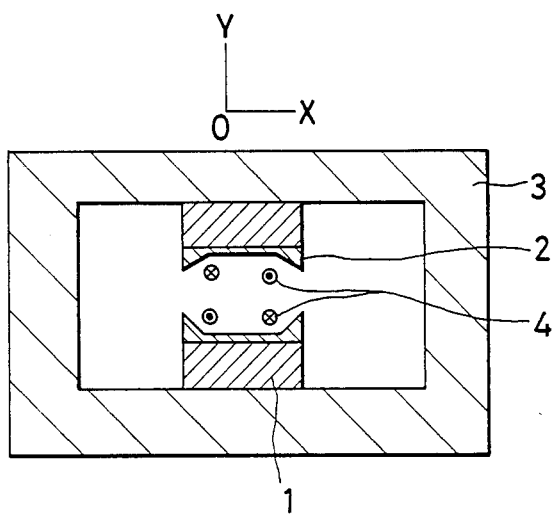
FIG. 2 is a schematic sectional view showing a first embodiment of a magnetic field generator according to the present invention.

FIG. 2 is a view showing a first embodiment of the magnetic field generator according to the present invention. The magnetic field generator comprises permanent magnets 1, pole pieces 2, and a yoke 3, and generates a uniform strong magnetic field between a space formed between these components.

Magnetic field inclining coils 4 (only magnetic field inclining coils in the X-direction is shown in the figure) are disposed in the vicinity of the magnetic poles 2. Pulse currents are applied to the coils 4 to generate an inclined magnetic field.

The rise time and the fall time of the magnetic field were measured with respect to the pole pieces 2 of different materials. The results are shown in Table 1.

TABLE 1

| | Pole piece material | Specific resistance ($\mu\Omega$-cm) | t1 (msec) | t2 (msec) |
|---|---|---|---|---|
| Embodiments | Silicon steel | 45 | 1.8 | 1.8 |
| | Permalloy | 60 | 1.7 | 1.7 |
| | Amorphous alloy | 130 | 1.2 | 1.2 |
| | Ferrite | >$10^6$ | 1 | 1 |
| | Magnetic composite material* (dust core) | $10^3$ | 1 | 1 |
| | Fe—Ni alloy | 20 | 2 | 2 |
| Compared | Magnetic soft | 10 | 3.5 | 3.5 |

TABLE 1-continued

| | Pole piece material | Specific resistance ($\mu\Omega$-cm) | t1 (msec) | t2 (msec) |
|---|---|---|---|---|
| example | iron | | | 5 |

In Table 1, the mark * indicates a dust core comprising a composite material made of Fe powder or Fe alloy powder and epoxy resin.

As is apparent from Table 1, if the specific resistance of the pole pieces is 20 $\mu\Omega$-cm or more, the t1 and t2 can be suppressed less than 2 msec respectively, and thus providing a practical magnetic field generator for the MRI. Further, it is seen in Table 1 that, when the specific resistance is 150 $\mu\Omega$-cm or more, the t1 and t2 can be suppressed less than below 1 msec.

For the magnetic field generator of the present invention, the material of the pole pieces is required only to have a specific resistance of 20 $\mu\Omega$-cm or more, and its constitution is not limited to the one shown in FIG. 2.

Figure 3:
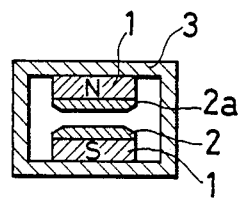
FIGS. 3 to 5 are schematic sectional views showing other embodiments of the magnetic field generator according to the present invention.
Figure 4:
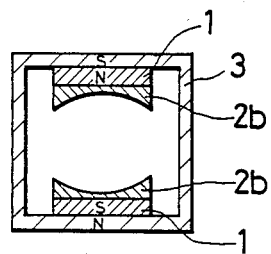
Figure 5:
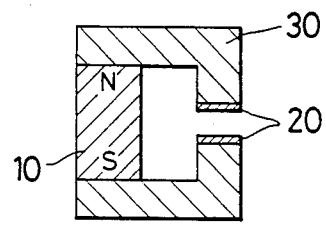

FIGS. 3 to 5 are views showing other embodiments of the magnetic field generator according to the present invention. In the figures, the numerals shown in FIG. 2 represent the same parts.

In FIG. 3, each pole piece 2a has a flat plate shape whose both corner edges are cut off.

In FIG. 4, each pole piece 2b has a concave surface, and, between the concave surfaces of the respective pole pieces 2b, a patient is placed.

In FIG. 5, a pair of yokes 30 are disposed in a U-shape and fixed to a permanent magnet 10. Pole pieces 20 are fitted to facing portions of the respective yokes 30, and a patient is placed between the pole pieces 20.

In FIGS. 3 to 5, magnetic field inclining coils are not shown.

It is apparent that the magnetic field generators shown in FIGS. 3 to 5 can also provide the effects of the present invention.

As described in the above, according to the present invention, pole pieces are specially made to reduce rise time and fall time at the time of generating a pulse magnetic field, thereby improving the S/N ratio of an image in the MRI.

In the Japanese Patent Application No. 61-48657, the inventors of the present invention have proposed a way to obtain a permanent magnet whose temperature coefficient of a residual magnetic flux density is 0.07%/deg and whose maximum energy product is 35 MGOe or more. The present invention uses this permanent magnet for a magnetic field generator to realize a permanent magnet type magnetic field generator which is compact and light-weight and can produce a strong magnetic field having excellent spatial uniformity and time-stability.

A permanent magnet of a rare earth iron system includes a strong magnetic Fe rich phase as a main phase which is a tetragonal system of an $Nd_2Fe_{14}B$ type. In addition to the main phase, other constitutional phases such as a non-magnetic R rich phase of a cubic system including R components such as $Nd_{97}Fe$ or $Nd_{95}Fe_5$ amounting to 90 weight percents or more of the non-magnetic R rich phase, and a non-magnetic B rich phase of a tetragonal system such as $Nd_1Fe_4B_4$, as well as including oxides. Other R components may be used in the same manner.

According to the present invention, the structural phases further include a non-magnetic Laves phase.

If only Co is added, it is effective to increase Curie temperature but it will cause a drawback that coercive force is decreased. This is because a Laves phase which is a magnetic phase is generated. It is understood that this Laves phase which is a magnetic phase, is a nucleation site of a reverse magnetic domain, decreasing the coercive force. The present invention non-magnetizes the Laves phase to improve the coercive force. Therefore, the present invention, while utilizing the effects of Co addition at most to increase the Curie temperature, further improves a magnetic characteristic. The permanent magnet of rare earth iron system having such a good coercive force has a good temperature characteristic in the magnetic characteristics. It is preferable to include the non-magnetic Laves phase in an amount of 2 to 10 volume percents. If the amount is too large, the proportion of a main phase generating magnetism is decreased, and Br is decreased. On the contrary, if the amount is too small, the amount of Co to be added is reduced so that the effects of increasing the Curie temperature cannot be obtained.

Other R rich phase, B rich phase, etc., are not indispensable. However, the R rich phase has a melting point lower than that of the main phase, and removes defects and foreign matters from an interface of the main phase at the time of sintering as well as reducing the respective generating sites of reverse magnetic domain to improve the coercive force. However, if the amount thereof is too large, the proportion of the main phase is reduced to reduce the magnetic characteristics so that the R rich phase is about 5 volume percents or less, preferably 2.5 to 5 volume percents.

To materialize the non-magnetic Laves phase, a predetermined amount of Al and/or Ga is added to a composition of, for instance, a specific R—B—Co—Fe system. Based on X-axis diffractions for the cases of adding no Co, adding Co only, and adding Co as well as Al, it is found, for all the cases, that the main phase is a Fe rich phase. When Co is added, peaks which indicate the existence of different phases appear in the vicinity of diffraction angles $2\theta'$ of 34° and 40°. After identifying the peaks by EPMA and TEM, it has been found that the peaks are (220) and (311) from $Nd(Fe,Co)_2$ cubic Laves phase of $MgCu_2$ type. Since the ratio of Fe and Co in the Laves phase is about 1:1, the Curie temperature is about 100° C., and the magnetism is maintained at room temperature. Since the coercive force of a permanent magnet of the rare earth iron system is determined by the nucleation of a reverse magnetic domain, it is apparent that the magnetic Laves phase is acting as a nucleation site of the reverse magnetic domain.

On the other hand, when Co and Al are added, peaks appears at $2\theta'$ of 34° and 40°, i.e., are shifted to lower angle sides. This fact indicates that the lattice constant of an $Nd(Fe,Co)_2$ phase is extended. Namely, it is extended from 7.3 Å to 7.42 Å. The atomic radius of an Al atom is 1.43 Å which is larger than each of those of Fe (1.26 Å) and Co (1.25 Å). Therefore, it is known that Al atoms exist in the Laves phase. Since the Al atom is non-magnetic, the $Nd(Fe,Co,Al)_2$ will be non-magnetic, and, since the non-magnetic Laves phase will never be a nucleation site of reverse magnetic domain, the coercive force can be improved.

The composition of a permanent magnet according to the present invention can properly be set. However, it is preferable to use a composition system of R for 10 to 40 weight percents, B for 0.1 to 8 weight percents, Co for 1 to 23 weight percents, and Fe for the remaining part. Even within the above composition range, if the non-magnetic Laves phase is not included, it will not fall in the scope of the present invention.

If the R components are included in an amount of less than 10 weight percents, the coercive force is small, and, if the amount is 40 weight percents or more, Br is decreased, decreasing (BH)max. Therefore, the amount of R is preferably 25 to 35 weight percents. Among the rare earth elements, Nd and Pr are effective to obtain high (BH)max. It is preferable, therefore, to contain at least one of Nd and Pr, preferably Nd as the R components. The ratio of these two elements, i.e., Nd and Pr is preferably 70 weight percents or more.

If B is less than 0.1 weight percents, iHc is decreased, and, if it is more than 8 weight percents, Br is decreased. The amount of B remarkably influence the magnetic characteristics, particularly Br so that the amount is preferably 0.8 to 0.95 weight percents, and more preferably 0.8 to 0.9 weight percents. If the amount of B is large, a non-magnetic B rich phase is increased, reducing the amount of the main phase and deteriorating the magnetic characteristics. A part of B can be substituted by C, N, Si, P, Ge, etc., to improve the sintering characteristics. However, the amount to be substituted is up to about 80 weight percents of the amount of B.

The element Co contributes to increasing the Curie temperature, and is effective to improve the temperature characteristics in the magnetic characteristics. An effective amount of Co to be added is 1 to 23 weight percents. To achieve the effective increase in Curie temperature, Co should be added to a certain extent, but, in view of the magnetic characteristics, it should not exceed 23 weight percents in order not to decrease the coercive force and (BH)max. The element Co should be added as much as possible to an extent not deteriorating the magnetic characteristics. The amount of Co to be added is preferably 5 weight percents or more, and more preferably 13 weight percents or more.

To realize the non-magnetic Laves phase, Al and/or Ga for instance are added as mentioned before. Al and Ga preferably decrease the Curie temperature of the Laves phase to change the same into a non-magnetic phase at a room temperature and improve the coercive force. Addition of 1 to 5 weight percents of them is effective. Other than Al and/or Ga, Re, Os, Ag, Ir, Pt, Au, Ti, V, Cu, Nb, Zn, Cr, Mn, Mo, Ru, Rh, Pd, Ta, W, etc., may be added, but their total quantity does not exceed 5 weight percents. Taking the magnetic characteristics into account, the most effective additives are Al and/or Ga.

The permanent magnet thus formed has the maximum energy product of 37 MGOe or more, and its temperature characteristics are −0.07%/deg which is half that of the prior art magnet. Therefore, if the permanent magnet is applied to a magnetic field generator, the generator is remarkably compact and stabilized.

Figure 6:
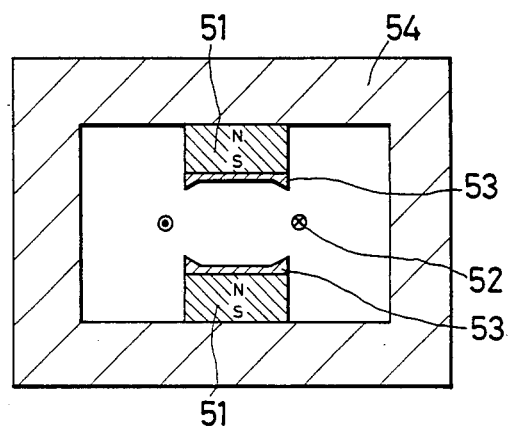
FIG. 6 is a schematic sectional view showing another embodiment of the magnetic field generator according to the present invention.

A magnetic field generator shown in FIG. 6 comprises permanent magnets 51, electric coils 52, pole pieces 53, and a yoke 54, and generates a strong uniform magnetic field within a space between the components. In FIG. 6, magnetic field inclining coils are not shown.

Table 2 is a list of comparison in which, (1) a magnet according to the present invention is used as a permanent magnet of a magnetic field generator, (2) in addition to the magnet according to the present invention, electric coils for uniformalizing a magnetic field are used for the generator, and (3) only the conventional Nd—Fe—B magnet is used for the generator. For all the cases, a weight of the permanent magnet, a magnetic field uniformity, and a temperature coefficient of a spatial magnetic field, required to obtain a magnetic field strength of 0.2 T in a space of 550 mm were examined.

TABLE 2

|  | Example (1) | Example (2) | Example (3) |
| --- | --- | --- | --- |
| Magnet composition | Nd 29.7 w. % B 0.9 w. % Co 14.8 w. % Al 0.4 w. % bal Fe | same as left | Nd 33 W. % B 1.2 W. % bal Fe |
| Weight of magnet | 0.84 ton | 0.8 ton | 0.9 ton |
| Uniformity | 50 ppm | 30 ppm | 50 ppm |
| Temperature coefficient | 0.07 %/deg | 0.07 %/deg | 0.14 %/deg |

As is apparent from Table 2, the present invention can provide a compact and light magnetic field generator having excellent temperature characteristics and uniformity. Pole pieces used for the present invention are basically required to have large saturation magnetization and soft magnetism as well as a specific resistance of 20 $\mu\Omega$-cm or more, preferably 150 $\mu\Omega$-cm or more, but other conditions thereof are freely selected. For instance, there may be used not only soft materials such as permalloy, silicon steel, amorphous magnetic alloy, and ferrite, but also magnetic composite materials which comprise magnetic powder such as iron powder and a binding material made of electric insulating material such as rubber and resin. Particularly, the magnetic composite materials are preferable because they can easily realize a specific resistance as large as, for instance, several hundreds $\Omega$-cm. By using the materials having such a large specific resistance, the rise time and the fall time of a pulse magnetic field generated by magnetic field inclining coils can be reduced to, for instance, 2 msec or less so that the S/N ratio of an image in the MRI can be improved, and energy consumption due to eddy current can be reduced.

In the embodiments of the present invention, the rise time and the fall time are 1 msec respectively when dust cores comprise composite materials made of Fe powder or Fe alloy powder and epoxy resin, and have a specific resistance value of $10^3$ $\mu\Omega$-cm and are used as materials for the pole pieces.

Figure 7A:
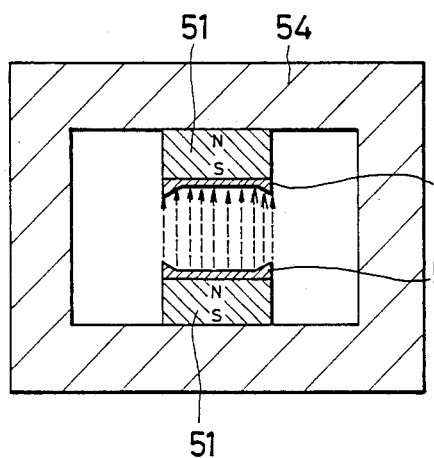
FIGS. 7A and 7B are sectional views showing the distribution states of lines of magnetic force with and without auxiliary coils, respectively.
Figure 7B:
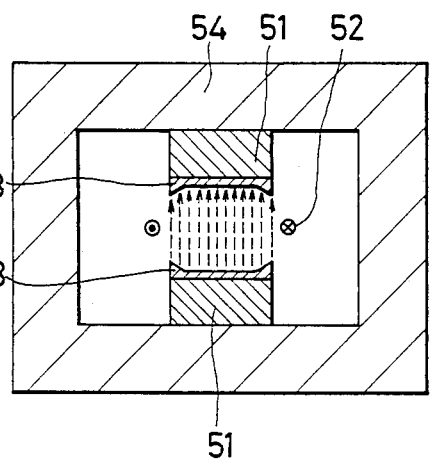

FIGS. 7A and 7B are views showing the distribution states of lines of magnetic force of two cases, one with auxiliary electric coils 52 and the other without the coils 52.

By providing one or more electric coils for uniformalizing a magnetic field in the vicinity of a permanent magnet, the uniformity of a magnetic field in a predetermined space can further be improved. In other words, the weight of the permanent magnet necessary for providing the same uniformity in the magnetic field can further be reduced.

As described in the above, according to the present invention, the composition of a permanent magnet is specialized, and coils are supplemented when required, to provide a magnetic field generator which can produce a strong magnetic field with excellent spatial uniformity and stability.

What is claimed is:
1. A magnetic field generator comprising:
a yoke;

a permanent magnet connected to the yoke and having a pair of magnetic poles opposite in polarity to each other;

a pair of pole pieces magnetically connected to the respective magnetic poles and arranged to face each other to generate a magnetic field in a clearance between the pole pieces, said pole pieces having a specific resistance of at least 20 $\mu\Omega$-cm which is changed depending on the rise and fall times of a waveform of a pulse magnetic field generated in the clearance.

2. A magnetic field generator as claimed in claim 1, wherein magnetic field inclining coils are arranged in the vicinity of the magnetic poles and a pulse electric current is supplied to the magnetic field inclining coils to generate an inclining magnetic field.

3. A magnetic field generator comprising:

a yoke;

a permanent magnet connected to the yoke and having a pair of magnetic poles opposite in polarity to each other;

a pair of pole pieces magnetically connected to the respective magnetic poles and arranged to face each other to generate a magnetic field in a clearance between the pole piece; and magnetic field inclining coils arranged in the vicinity of the magnetic poles, a pulse electric current being supplied to the magnetic field inclining coils to generate an inclining magnetic field in the clearance;

said pole pieces having a specific resistance of at least 20 $\mu\Omega$-cm which is changed depending on the rise and fall times of a waveform of the inclining magnetic field.

4. A magnetic field generator as claimed in claim 1, wherein said permanent magnet comprises a sintered alloy including iron as a main component, a rare earth element including yttrium, cobalt, and boron, said permanent magnet including, as a main part thereof, a strong magnetic Fe rich phase of a tetragonal system as well as a non-magnetic Laves phase, and having a maximum energy product of 38 MGOe or more.

5. A magnetic field generator as claimed in claim 1, wherein said permanent magnet contains R for 10 to 40 weight percents, B for 0.1 to 8 weight percents, Co for 1 to 23 weight percents, Al and/or Ga for 0.2 to 5 weight percents, and Fe substantially for the remaining part.

6. A magnetic field generator as claimed in claim 1, wherein said pole pieces have large saturation magnetization and are made of soft magnetic materials.

7. A magnetic field generator as claimed inc claim 1, wherein said pole pieces are made of at least one of the following: permalloy, silicon steel, amorphous magnetic alloy, or ferrite.

8. A magnet field generator as claimed in claim 1, wherein said pole pieces are made of magnetic composite material comprising magnetic powder and a binding material made of electric insulating material.

9. A magnetic field generator as claimed in claim 2, wherein said permanent magnet is formed of a sintered alloy including iron as a main component, a rare earth element including yttrium, cobalt, and boron, said permanent magnet including, as a main part thereof, a strong magnetic Fe rich phase of a tetragonal system as well as a non-magnetic Laves phase, and having a maximum energy product of 38 MGOe or more.

10. A magnetic field generator as claimed in claim 2, wherein said permanent magnet contains R for 10 to 40 weight percents, B for 0.1 to 8 weight percents, Co for 1 to 23 weight percents, Al and/or Ga for 0.1 to 5 weight percents, and Fe substantially for the remaining part.

11. A magnetic field generator as claimed in claim 2, wherein said pole pieces have large saturation magnetization and are made of soft magnetic material.

12. A magnetic field generator as claimed in claim 2, wherein said pole pieces are made of at least one of the following: permalloy, silicon steel, amorphous, magnetic alloy, or ferrite.

13. A magnetic field generator as claimed in claim 2, wherein said pole pieces are made of magnetic composite material comprising magnetic powder and a binding material made of electric insulating material.

* * * * *